United States Patent
Saxler

(10) Patent No.: US 7,759,682 B2
(45) Date of Patent: Jul. 20, 2010

(54) LED WITH SUBSTRATE MODIFICATIONS FOR ENHANCED LIGHT EXTRACTION AND METHOD OF MAKING SAME

(75) Inventor: Adam W. Saxler, Durham, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/210,713

(22) Filed: Aug. 23, 2005

(65) Prior Publication Data

US 2006/0001056 A1    Jan. 5, 2006

Related U.S. Application Data

(62) Division of application No. 11/083,460, filed on Mar. 17, 2005, now Pat. No. 7,534,633.

(60) Provisional application No. 60/585,326, filed on Jul. 2, 2004.

(51) Int. Cl.
  H01L 27/15 (2006.01)
  H01L 29/26 (2006.01)
  H01L 31/12 (2006.01)
  H01L 33/00 (2006.01)
(52) U.S. Cl. ..................................................... 257/79
(58) Field of Classification Search .................... None
  See application file for complete search history.

(56) References Cited

U.S. PATENT DOCUMENTS

| | | | |
|---|---|---|---|
| 4,346,275 A | 8/1982 | Ieakiri et al. | 200/314 |
| 4,476,620 A | 10/1984 | Ohki et al. | 438/33 |
| 4,865,685 A | 9/1989 | Palmour | 156/643 |
| 4,902,356 A | 2/1990 | Noguchi et al. | 148/33.4 |
| 4,912,532 A | 3/1990 | Cook et al. | 357/16 |
| 4,946,547 A | 8/1990 | Palmour et al. | 156/643 |
| 4,981,551 A | 1/1991 | Palmour | 156/643 |
| 5,087,949 A | 2/1992 | Haitz et al. | 357/17 |

(Continued)

FOREIGN PATENT DOCUMENTS

EP    0684648    11/1995

(Continued)

OTHER PUBLICATIONS

Khan F. A. et al, "High Rate Etching of SIC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.

(Continued)

*Primary Examiner*—Dao H Nguyen
*Assistant Examiner*—Tram H Nguyen
(74) *Attorney, Agent, or Firm*—Koppel, Patrick, Heybl & Dawson

(57) ABSTRACT

The surface morphology of an LED light emitting surface is changed by applying processes, such as a reactive ion etch (RIE) process to the light emitting surface. In one embodiment, the changed surface morphology takes the form of a moth-eye surface. The surface morphology created by the RIE process may be emulated using different combinations of non-RIE processes such as grit sanding and deposition of a roughened layer of material or particles followed by dry etching.

9 Claims, 3 Drawing Sheets

U.S. PATENT DOCUMENTS

| | | | | |
|---|---|---|---|---|
| 5,103,271 | A | 4/1992 | Izumiya et al. | 357/17 |
| 5,200,022 | A | 4/1993 | Kong et al. | 156/612 |
| 5,376,241 | A | 12/1994 | Shor et al. | 204/129.3 |
| 5,376,580 | A | 12/1994 | Kish et al. | 437/127 |
| RE34,861 | E | 2/1995 | Davis et al. | 437/100 |
| 5,502,316 | A | 3/1996 | Kish et al. | 257/94 |
| 5,644,156 | A | 7/1997 | Suzuki et al. | 257/485 |
| 5,779,924 | A * | 7/1998 | Krames et al. | 216/24 |
| 5,803,579 | A | 9/1998 | Turnbull et al. | |
| 5,939,732 | A | 8/1999 | Kurtz et al. | 257/77 |
| 5,985,687 | A | 11/1999 | Bowers et al. | 438/46 |
| 6,071,795 | A | 6/2000 | Cheung et al. | 438/458 |
| 6,132,072 | A | 10/2000 | Turnbull et al. | |
| 6,212,213 | B1 | 4/2001 | Weber et al. | |
| 6,225,647 | B1 | 5/2001 | Kurtz et al. | 257/94 |
| 6,234,648 | B1 | 5/2001 | Borner et al. | |
| 6,258,699 | B1 | 7/2001 | Chang et al. | 438/458 |
| 6,274,924 | B1 | 8/2001 | Carey et al. | 257/676 |
| 6,303,405 | B1 | 10/2001 | Yoshida et al. | 438/46 |
| 6,365,429 | B1 | 4/2002 | Kneissl et al. | 438/46 |
| 6,410,942 | B1 | 6/2002 | Thibeault et al. | 257/88 |
| 6,420,199 | B1 | 7/2002 | Coman et al. | 438/22 |
| 6,420,242 | B1 | 7/2002 | Cheung et al. | 438/458 |
| 6,429,460 | B1 | 8/2002 | Chen et al. | 257/79 |
| 6,448,102 | B1 | 9/2002 | Kneissl et al. | 438/46 |
| 6,465,809 | B1 | 10/2002 | Furukawa et al. | 257/94 |
| 6,468,824 | B2 | 10/2002 | Chen et al. | 438/46 |
| 6,513,949 | B1 | 2/2003 | Marshall et al. | |
| 6,538,371 | B1 | 3/2003 | Duggal et al. | |
| 6,550,949 | B1 | 4/2003 | Bauer et al. | |
| 6,552,495 | B1 | 4/2003 | Chang | |
| 6,559,075 | B1 | 5/2003 | Kelly et al. | 438/795 |
| 6,562,648 | B1 | 5/2003 | Wong et al. | 438/46 |
| 6,577,073 | B2 | 6/2003 | Shimizu et al. | |
| 6,607,931 | B2 | 8/2003 | Streubel | 438/22 |
| 6,657,236 | B1 * | 12/2003 | Thibeault et al. | 257/98 |
| 6,677,173 | B2 | 1/2004 | Ota | 438/22 |
| 6,692,136 | B2 | 2/2004 | Marshall et al. | |
| 6,716,654 | B2 | 4/2004 | Hsu et al. | 438/22 |
| 6,740,604 | B2 | 5/2004 | Kelly et al. | 438/795 |
| 6,757,314 | B2 | 6/2004 | Kneissl et al. | 372/50 |
| 6,784,463 | B2 | 8/2004 | Camras et al. | |
| 6,786,390 | B2 | 9/2004 | Yang et al. | 228/179.1 |
| 6,800,500 | B2 | 10/2004 | Coman et al. | 438/22 |
| 6,806,112 | B1 | 10/2004 | Horng et al. | 438/29 |
| 6,809,341 | B2 | 10/2004 | Hsu et al. | 257/79 |
| 6,809,347 | B2 | 10/2004 | Tasch et al. | |
| 6,817,735 | B2 | 11/2004 | Shimizu et al. | |
| 6,841,804 | B1 | 1/2005 | Chen et al. | |
| 6,846,686 | B2 | 1/2005 | Saeki et al. | 438/22 |
| 6,849,878 | B2 | 2/2005 | Bader et al. | 257/103 |
| 6,884,647 | B2 | 4/2005 | Sakai et al. | 438/30 |
| 6,914,267 | B2 | 7/2005 | Fukasawa et al. | |
| 6,936,857 | B2 | 8/2005 | Doxsee et al. | |
| 6,972,438 | B2 * | 12/2005 | Li et al. | 257/98 |
| 7,005,679 | B2 | 2/2006 | Tarsa et al. | |
| 7,008,078 | B2 | 3/2006 | Shimizu et al. | |
| 7,014,336 | B1 | 3/2006 | Ducharme et al. | |
| 7,066,623 | B2 | 6/2006 | Lee et al. | |
| 7,095,056 | B2 | 8/2006 | Vitta et al. | |
| 7,213,940 | B1 | 5/2007 | Van De Ven et al. | |
| 2001/0010449 | A1 | 8/2001 | Chiu et al. | |
| 2002/0139990 | A1 | 10/2002 | Suehiro et al. | |
| 2002/0153835 | A1 | 10/2002 | Fujiwara et al. | |
| 2002/0163302 | A1 | 11/2002 | Nitta et al. | |
| 2003/0030063 | A1 | 2/2003 | Sosniak et al. | |
| 2003/0124752 | A1 * | 7/2003 | Wei et al. | 438/22 |
| 2003/0146411 | A1 | 8/2003 | Srivastava et al. | |
| 2003/0173602 | A1 | 9/2003 | Hsu et al. | |
| 2004/0070004 | A1 | 4/2004 | Eliashevich et al. | |
| 2004/0072382 | A1 | 4/2004 | Kelly et al. | |
| 2004/0094774 | A1 | 5/2004 | Steigerwald et al. | |
| 2004/0105261 | A1 | 6/2004 | Ducharme et al. | |
| 2004/0188697 | A1 | 9/2004 | Brunner et al. | |
| 2004/0217364 | A1 | 11/2004 | Tarsa et al. | |
| 2005/0077531 | A1 | 4/2005 | Kim | |
| 2005/0082562 | A1 | 4/2005 | Ou et al. | |
| 2005/0082974 | A1 | 4/2005 | Fukasawa et al. | |
| 2005/0104080 | A1 | 5/2005 | Ichihara | |
| 2005/0173724 | A1 * | 8/2005 | Liu | 257/103 |
| 2005/0227379 | A1 | 10/2005 | Donofrio | |
| 2006/0012989 | A1 | 1/2006 | Lee | |
| 2006/0105482 | A1 | 5/2006 | Alferink et al. | |
| 2007/0057271 | A1 | 3/2007 | Schiaffino et al. | |
| 2007/0200127 | A1 | 8/2007 | Andrews et al. | |
| 2007/0262338 | A1 | 11/2007 | Higashi et al. | |

FOREIGN PATENT DOCUMENTS

| | | |
|---|---|---|
| EP | 1059667 | 12/2000 |
| EP | 1156020 A1 | 11/2001 |
| EP | 1246266 | 10/2002 |
| EP | 1263058 A | 12/2002 |
| EP | 1345275 A | 9/2003 |
| JP | 61059886 | 3/1986 |
| JP | 10-163535 | 6/1998 |
| JP | 11238913 | 8/1999 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-356116 | 12/2004 |
| JP | 2005-142311 | 6/2005 |
| WO | WO 03005458 A1 | 1/2003 |
| WO | WO 03010832 | 2/2003 |
| WO | WO2005048361 A2 | 5/2005 |
| WO | WO 2005/124877 | 12/2005 |
| WO | WO2006035664 A | 4/2006 |

OTHER PUBLICATIONS

Palmour J W et al., "Crystallographic Etching Phenomenon During Plasma Etching of SIC (100) Thin Films in SF6", Journal of the Electrochemical Society, Electrochemical Society. Manchester, New Hampshire, U.S., vol. 136, No. 2, Feb. 1, 1989, pp. 491-495.

Kelner G. et al., "Plasma Etching of Beta-SIC", Journal of the Electrochemical Society, Electrochemical Society. Manchester, New Hampshire, U.S. vol. 134, No. 1, Jan. 1987, pp. 253-254.

Windisch at al., *Impact of Texture-Enhanced Transmission on High-Efficiency Surface-Textured Light-Emitting Diodes*, Applied Physics Letters, vol. 79, No. 15, Oct. 8, 201, pp. 2315-2317.

Schnitzer et al., 30% *External Quantum Efficiency From Surface Textured, Thin-Film Light-Emitting Diodes*, Applied Physics Lett. 63(16), Oct. 18, 1993, pp. 2174-2176.

Windisch at al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.

Streubel et al., *High Brightness AlGaInP Light-Emitting Diodes*. IEEE Journal on Selected Topics in Quantum Electronics, vol. 8, No. 2, Mar./Apr. 2002, pp. 321-332.

Shor at al., *Direct Observation of Porous SiC Formed by Anodization in HF*, Appl. Phys. Lett. 62 (22), May 31, 1993, pp. 2836-2838.

Windisch at al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.

Windisch at al., *Non-Resonant Cavity Light-Emitting Diodes*, In Light-Emitting Diodes: Research, Manufacturing, and Applications IV, H. Walter Yao et al., Proceedings of SPIE vol. 3938 (2000), pp. 70-76.

Zangooie at al., *Surface, Pore Morphology, and Optical Properties of Porous 4H-SiC*, Journal of the Electrochemical Society, 148(6) G297-G302 (2001) Jan. 9, 2001.

Mimura et al, *Blue Electroluminescence From Porous Silicon Carbide*, Appl. Phys. Lett 65(26), Dec. 26, 1994, pp. 3350-3352.

Kasugai et al., "Moth-Eye Light-Emitting Diodes", Mater Res. Soc. Symp. Proc. vol. 831, 2005 Materials Research Society, pp. E1.9.1-E1.9.6.

Lagoubi, et al. "Conditioning of N-Silicon by Photoelectrochemical Etching for Photovoltaic Applications", Proc. of the $11^{TH}$ E.C. Photovoltaic Solar Energy Conference, Oct. 12, 1992-Oct. 16, 1992, pp. 250-253, XP008043956, pp. 252-253 Figure 8.

Patent Abstracts of Japan 07007179, Oct. 1995, Sanyo Electric Co Ltd, "Light Emitting Elements".

Journal of Optics A; Pure and Applied Optics 7 (2005) S3-S11, Review Article "Left-Handed Electromagnetism Obtained Via Nanostructured Metamaterials: Comparison With That From Microstructured Photonic Crystals", Mathias Perrin et al.

Journal of Modern Optics vol. 52, No. 8, May 2005, pp. 1155-1160, "Design and Fabrication of Omnidirectional Reflectors in the Visible Range", Weihua Lin et al.

American Institute PF Physics Handbook, Third Edition, McGraw-Hill, ED: Dwight E. Gray, 1972.

Related Indian Patent Application No. 4867/DELNP/2005, first examination report dated: Apr. 4, 2008.

PCT International Preliminary Report, Date: Mar. 27, 2008, PCT/US05/20603.

U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.

Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.

Cree® XLamp® 7090 XR-E Series LED Binning and Labeling.

PCT International Search Report and Written Opinion from related PCT application No. PCT/US2008/010703, date: Aug. 26, 2009.

* cited by examiner

FIG. 6
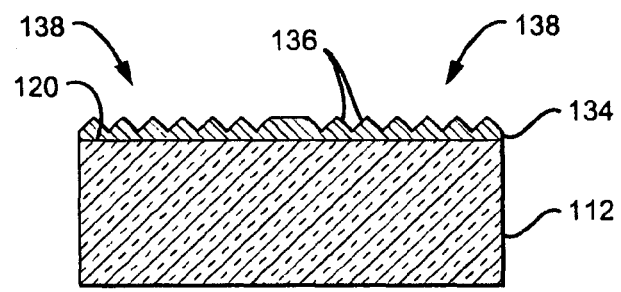
FIG. 7
FIG. 8
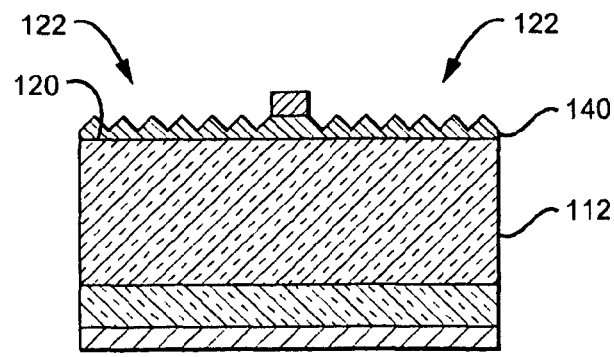

LED WITH SUBSTRATE MODIFICATIONS FOR ENHANCED LIGHT EXTRACTION AND METHOD OF MAKING SAME

RELATED APPLICATION DATA

This application is a divisional from U.S. patent application Ser. No. 11/083,460 filed on Mar. 17, 2005 now U.S. Pat. No. 7,534,633 which claims the benefit of U.S. Provisional patent application Ser. No. 60/585,326 filed Jul. 2, 2004.

BACKGROUND OF THE INVENTION

1. Field of the Invention

This invention relates to light emitting diodes (LEDs) and more particularly to new surface morphologies for enhancing the extraction of light from LEDs and methods of manufacturing LEDs having such surfaces.

2. Description of Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree, Inc., of Durham, N.C. and methods for producing them are set forth in the scientific literature as well as in U.S. patents, U.S. Pat. No. Re. 34,861; U.S. Pat. Nos. 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction, with one of the more popular being surface texturing. Surface texturing increases the light's escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,410,942, assigned to Cree, Inc., discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR.

U.S. Pat. No. 6,657,236, also assigned to Cree Inc., discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters.

SUMMARY OF THE INVENTION

Briefly, and in general terms, the invention is directed to light emitting diodes (LEDs) formed by processes that allow for the creation of surfaces that provide enhanced light extraction and methods of manufacturing LEDs having such surfaces. In one of several aspects, the invention relates to a method of fabricating an LED that includes a substrate having a light emitting surface. The method includes applying a reactive ion etch (RIE) process to at least a portion of the light emitting surface for a time duration sufficient to change the morphology of the surface.

In another aspect, the invention relates to a light emitting diode (LED) that includes a conductive substrate having a first surface and a second surface. A portion of the first surface has a moth-eye morphology. The LED also includes a light emission region on the second surface. The light emission region includes an active layer between first and second oppositely doped layers. The LED further includes a first contact on the first surface that is in contact with one of the first or second doped layers and a second contact in contact with the other of the first or second doped layers.

In yet another aspect, the invention involves a method of fabricating a light emitting diode (LED) that includes growing a light emission region on a first surface of a substrate. The light emission region includes an active layer between first and second oppositely doped layers. The method also includes creating a moth-eye morphology in at least a portion of a second surface of the substrate, forming a first contact on the second surface of the substrate that is in contact with one of the first or second doped layers, and forming a second contact in contact with the other of the first or second doped layers.

In another aspect, the invention relates to another method of fabricating a light emitting diode (LED). This method includes growing a light emission region on a first surface of a substrate. The light emission region includes an active layer between first and second oppositely doped layers. The method also includes forming a layer on a second surface of the substrate. This layer has a refractive index substantially the same as the substrate and a moth-eye surface morphology. The method further includes forming a first contact on the layer and in contact with one of the first or second doped layers and forming a second contact in contact with the other of the first or second doped layers.

These and other aspects and advantages of the invention will become apparent from the following detailed description and the accompanying drawings which illustrate by way of example the features of the invention.

BRIEF DESCRIPTION OF THE DRAWINGS

FIG. 6 is a sectional image of a moth-eye surface;

FIG. 7 is a sectional view of an LED substrate having a non-continuous layer formed on its top surface; and FIG. 8 is a sectional view of an LED including an additional, moth-eye-surfaced layer on its substrate.

DETAILED DESCRIPTION OF THE INVENTION

The present invention provides improved light extraction for light emitting diodes (LEDs) through the addition of a particular type of surface morphology to the back surface of the LED substrate. The surface morphology is created in the substrate through one or more additional steps in the LED fabrication process.

In one embodiment the back surface morphology of a SiC substrate is modified using a reactive ion etch (RIE) process and more particularly an inductively coupled plasma reactive ion etch (ICP-RIE) process. This process creates one or more surface areas characterized by a dimpled texture on a microscopic scale. The dimpled surface provides a varying surface that allows light that would otherwise be trapped in the LED, by total internal reflection (TIR), to escape from the substrate to contribute to light emission. The variations in the surface increase the chances that the TIR light will reach the substrate surface within the critical angle and will be emitted. For light that does not escape the substrate through the surface, the variations of the surface reflect the light at different angles, increasing the chances that the light will escape on the next pass. The resultant scattering surface morphology leads to an improvement in light extraction and more light out of a packaged LED die compared to a conventional device.

Figure 1:
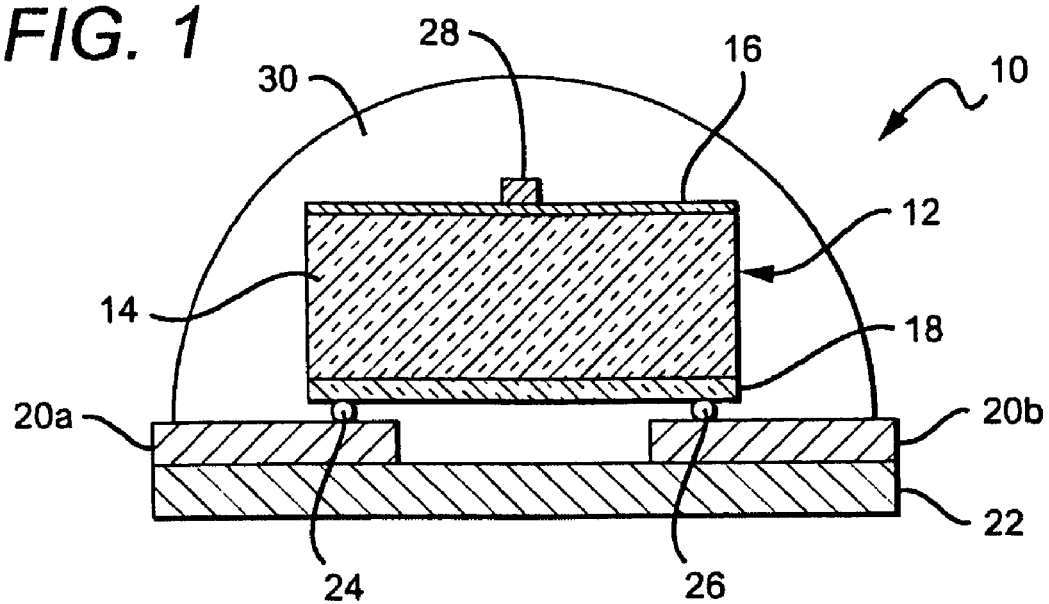
FIG. 1 is a sectional view of an LED including an emitting surface having a modified surface morphology.

Referring now to the drawings and particularly to FIG. 1, there is shown one embodiment of an LED package 10 according to the present invention, which includes an LED 12 comprising a substrate 14 having a modified back surface 16 to improve light extraction of LED light passing through the substrate. The substrate 14 can be made of many materials and can be many different thicknesses, with a suitable substrate being a 4H polytype of silicon carbide with a thickness range of 125-500 microns, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible.

The LED 12 comprises a standard emission region 18 formed on the substrate 14 using known processes such as metal-organic chemical vapor deposition (MOCVD). The operational details of conventional LEDs are known and are only briefly discussed. The LED's emission region 18 can include an active layer sandwiched between two oppositely doped layers, with the layers having standard thicknesses and the active layer emitting light omnidirectionally when a bias is applied across the oppositely doped layers.

The layers of the emission region may be fabricated from different material systems such as the Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In a preferred embodiment, the material forming the doped layers is GaN and the material forming the active layer is InGaN. In alternative embodiments the material of the doped layers may be AlGaN, AlGaAs or AlGaInP.

The LED 12 is arranged in the package 10 in a flip-chip orientation with the top of the substrate 14 being the LED's primary emission surface. Other surfaces of the substrate 14, such as the sides, also emit light but the top surface is generally the primary emission surface. The LED 12 is flip-chip mounted on first and second metal layers or solder bumps 20a, 20b which are part of a submount 22. A first contact 24 is coupled between the first metal layer 20a and one of the oppositely doped layers in the emission region 18 and a second contact 26 is coupled between the second metal layer 20b and the emission region's other doped layer. A bias can be applied to the contacts 24, 26 through the first and second metal layers 20a, 20b, and the bias is then conducted through the contact 24, 26 to the oppositely doped layers in the emission region, causing the active layer to emit light.

In other LED embodiments having a substrate that is conductive enough to transmit a charge, a substrate contact 28 can be used to apply a bias to one of the oppositely doped layers. The other doped layer is contacted to one of the contacts 24, 26 arranged between the metal layers 20a, 20b and the LED. A bias is applied to the LED through contact 28 and one of the metal layers 20a, 20b, and the bias can be conducted to the substrate contact from the other of the metal layers, through a conductive wire (not shown) that runs from the metal layer to the substrate contact.

The top surface of the metal layers 20a, 20b can also be reflective so that light emitted from the emission region toward the metal layers is reflected back to contribute to the overall emission of the LED package 10. The LED 12 and its contacts can be encased in a clear protective material 30, which is typically a transparent epoxy covering the LED 12 and the top surface of the metal layers 20a, 20b.

Alternatively, the LED 12 can be mounted on the horizontal base of a "metal cup" that typically has conductive paths (not shown) for applying a bias across the contacts on the emission regions oppositely doped layers. The top surface of the metal cup can also be reflective to reflect light from the emission region such that the light contributes to the light emission of the LED package.

The substrate 14 comprises a modified back surface 16 that, in the flip-chip arrangement of the LED 12 is the top and primary emission surface of the LED. The modified surface 16 enhances the light emission of the LED 12. The efficiency of conventional LEDs is limited by their inability to emit all of the light that is generated by the active layer. When the flip-chip arranged LED is emitting, light reaches the primary emitting substrate surface at many different angles. Typical substrate semiconductor materials have a high index of refraction compared to ambient air or encapsulating epoxy. Light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

The modified surface 16 improves light extraction of the LED 12 by providing a varying surface that allows light that would otherwise be trapped in the LED, by total internal reflection (TIR), to escape from the substrate to contribute to light emission. The variations in the modified surface increase the chances that the TIR light will reach the substrate surface within the critical angle and will be emitted. For light that does not escape the substrate through the modified surface, the variations of the modified surface reflect the light at different angles, increasing the chances that the light will escape on the next pass. Additional embodiments of LEDs having a modified substrate surface are described below.

Figure 2:
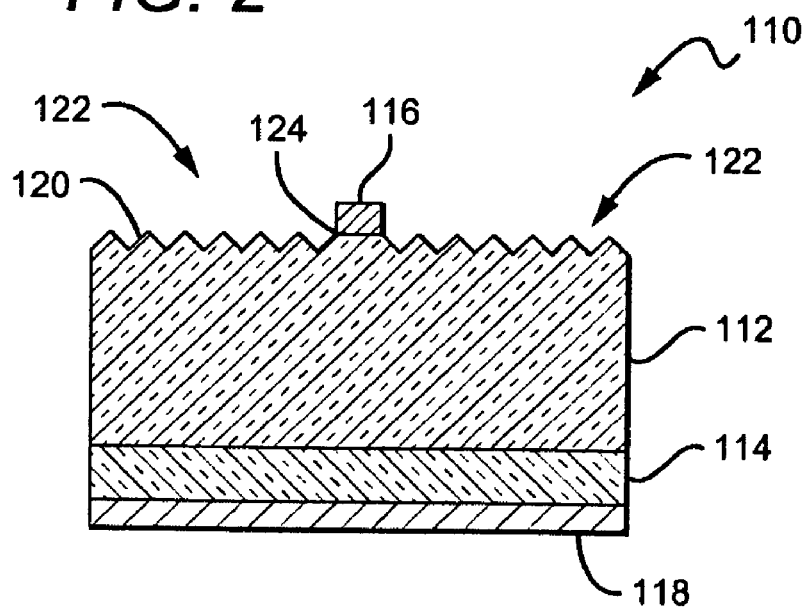
FIG. 2 is a sectional view of an LED including an emitting surface having a moth-eye surface morphology.

FIG. 2 shows another embodiment of an LED 110 according to the present invention that includes a conductive substrate 112 with a semiconductor emission region 114 formed on one of its surfaces. The emission region 114 is similar to the emission region 18 in FIG. 1. The LED 110 includes first and second contacts 116, 118 that contact the oppositely doped layers in the emission region 114. When a bias is applied to the oppositely doped layers, through the contacts 116, 118, light is emitted. The LED 110 may be flip-chip mounted such that the substrate surface 120 opposite the emission region 114 is the primary emitting surface of the LED.

Portions 122 of the primary emitting surface 120 include a surface morphology that includes a collection of elements. Attributes, including element "profile" or shape may be used to characterize a particular surface morphology. As explained below, in one configuration, these morphed portions 122 of the emitting surface 120 are formed entirely and directly in the substrate 112 and preferably without the use of a mask. In other configurations, the morphed portions 122 are formed at least partially within the substrate. In other configurations the morphed portions 122 are formed in another layer of material on top of the emitting surface 120 of the substrate 112.

Other portions 124 of the primary emitting surface 120, such as the portion beneath the first contact 116, are substantially smooth. The smooth surface provides for a large surface area of direct contact between the contact 116 and the substrate 112 which in turn allows for efficient transfer of current from the contact into the substrate.

Figure 3:
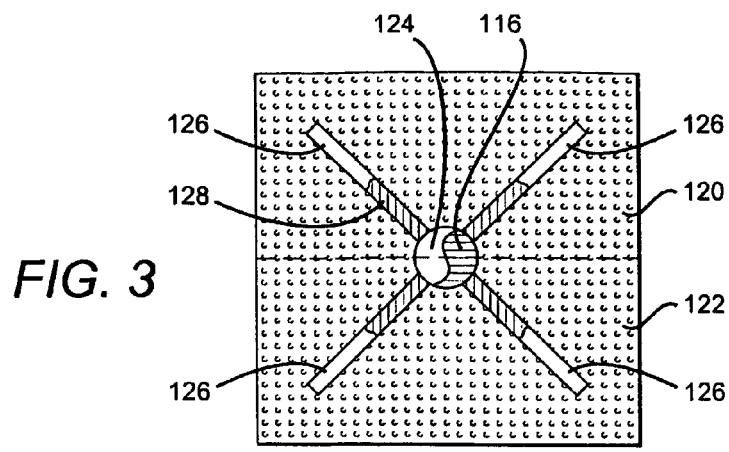
FIG. 3 is a top view of the of the LED of FIG. 2.

With reference to FIG. 3, in a preferred embodiment, the primary emitting surface 120 includes additional smooth surface areas 126; Conductive elements 128 are formed on these surface areas 126 and are electrically connected to the first contact 116. These additional conductive elements 128 form a current spreading structure that provides for more efficient distribution of current across the surface area of the substrate 112. These smooth portions 124, 126 are formed by masking the top surface 120 of the substrate prior to creating the morphed portions 122.

Figure 4:
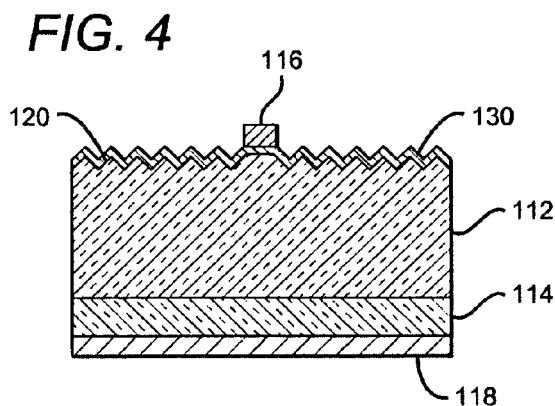
FIG. 4 is a sectional view of an LED including a moth-eye emitting surface with an overlying layer of transparent conducting material.

With reference to FIG. 4, in an alternative configuration, more efficient current spreading is provided by a current spreading layer 130 located on the primary emitting surface 120. In one configuration, the current spreading layer 130 is a layer of transparent conducting material that is deposited on the primary emitting surface 120. The transparent conducting material may be a metal, such as Pd, Ni or Au, having a thickness of between approximately 2 nm and 20 nm; a transparent conducting oxide, such as indium tin oxide, having a thickness of approximately 100 nm; or a semiconductor material.

For the semiconductor material configuration, the material may be an additional layer of heavily doped semiconductor material that is deposited on the primary emitting surface 120. In this context, "heavily doped" means more doped than the substrate 112. Such semiconductor materials may include, for example, SiC, GaN and AlInGaN. The material generally has the same or similar refractive index as the substrate 112 and the same n-type or p-type doping as the substrate. Thus, if the substrate 112 is formed of n-type SiC the layer of additional material 130 may be n-type SiC or AlInGaN; and if the substrate is formed of n-type GaN, the additional material would be n-type GaN. The thickness of the semiconductor material layer depends on the doping concentration. For example, if the doping concentration is greater than $1^{20}$ cm$^{-3}$, a thickness of approximately 100 nm should be sufficient.

Figure 5:
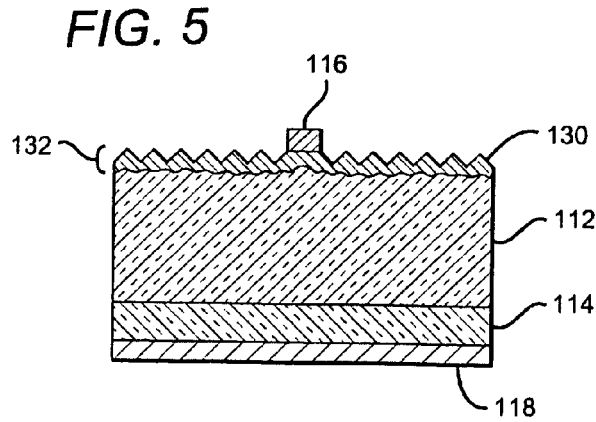
FIG. 5 is a sectional view of an LED including a moth-eye emitting surface formed in a current spreading region of the substrate.

With reference to FIG. 5, in another configuration, the current spreading layer 130 is part of the substrate 112 itself. In this embodiment, a top surface region 132 of the substrate 112 is subjected to further doping to increase its conductivity. The heavily doped, top surface region 132 of the substrate 112 provides current spreading without the need for an additional layer of material. In this context, "heavily doped" means that the top surface region 132 of the substrate 112 is more heavily doped than the remaining portion of the substrate. The thickness of this more heavily doped region 132 of the substrate depends on the doping concentration. For example, if the doping concentration is greater than $1^{20}$ cm$^{-3}$, a thickness of approximately 100 nm should be sufficient.

Returning to FIG. 2, the morphed portions 122 of the primary emitting surface 120 may be formed using any one of several processes, each employing techniques that are well known in the art. In one method, the morphed portions 122 are formed by directly etching the primary emitting surface 120 of the substrate 112, without the use of a mask, using a dry etching process such as reactive ion etching (RIE). This process is known to cause substrate surfaces to assume a surface morphology like that shown in FIG. 6. Such a morphology has been referred to as a "moth-eye" surface. See Kasugai et al., *Moth-Eye Light Emitting Diodes*, Mater. Res. Soc. Symp. Proc. Vol. 831, 2005 Material Research Society.

With reference to FIG. 7, in another embodiment, the morphed portions 122 (FIG. 2) are formed by coating the emitting surface 120 with a thin, non-continuous layer 134 of material or particles. A "non-continuous layer" as used herein means a layer, which may be formed of one or more sub-layers, having top surface elements 136 that cause the layer to have a cross section of non-uniform thickness, at a microscopic level. In one embodiment, the density of elements in the layer 134 and the size of the elements are selected such that the top surface of the layer has a morphology with a periodicity, profile and depth similar to the moth-eye surface achieved through RIE etching. The surface morphology 138 of the non-continuous layer 134 is then transferred at least partially to the substrate 112 by either partially or completely removing the non-continuous layer. "Transferred" as used in this context means that after partial or complete removal of the non-continuous layer 134, the substrate 112 surface has substantially the same surface morphology that the non-continuous layer had prior to the removal or partial-removal process.

The non-continuous layer 134 is preferably removed using a dry etch process. As a cost saving measure, the dry etching process is preferably not an RIE process, and may be, for example, involve etching with a fluorine-containing gas such as nitrogen trifluoride, nitrous oxide, ammonium trifluoride, oxygen, sulfur hexafluoride, carbon tetrafluoride, or mixtures thereof. Exemplary techniques for dry etching silicon carbide are set forth in U.S. Pat. Nos. 4,865,685 and 4,981,551 which are incorporated entirely herein by reference. In this embodiment, the non-continuous layer 134 is made of material or materials that etch at approximately the same rate as the substrate 112. Such an etching rate ensures that the surface morphology 138 of the non-continuous layer 134 transfers at least partially to the substrate 112.

In other embodiments, the surface morphology 138 of the non-continuous layer 134 may not match the desired surface morphology for the substrate 112. For example, the depth of the elements 136 on the surface of the non-continuous layer 134 may be larger than desired. In this case, the non-continuous layer 134 may be made of material or materials that etch at a faster rate relative to the substrate 112. The end result is a substrate 112 with a surface morphology having elements with less depth than the elements 136 of the non-continuous layer 134. The characteristics of the surface morphology of the non-continuous layer 134 and the etch rates of the non-continuous layer relative to the substrate 112, allow for control of the shape of the substrate surface morphology. Through proper selection of each, the desired substrate surface morphology may be obtained.

In one configuration, the non-continuous layer 134 is formed by depositing a thin layer of metal, e.g., gold or aluminum, under conditions that make the layer non-continuous. For example, the metal may be exposed to a temperature that is high enough to result in diffusion of the metal and formation of islands projecting from the surface of the layer. Higher temperatures and longer exposure times will result in fewer, larger islands. Thus the size, shape and density of the islands may be controlled by temperature and exposure time to create the desired surface morphology.

In other configurations, the non-continuous layer 134 is formed by first depositing a uniform layer of metal and then making the uniform layer non-uniform by 1) depositing a non-continuous mask layer over the uniform layer and then etching the layer of metal to form the desired surface morphology; or 2) depositing nano-particles on the uniform layer using an aerosol or other gas-phase chemical reaction and then etching to form the desired surface morphology on the underlying uniform layer.

In another embodiment, the non-uniform layer 134 may be formed of nano-particles. The particles may be suspended in a liquid that is evenly deposited over the substrate surface 120 by, for example, using a spinner with a rotation speed determined by the desired thickness of the layer of particles and the properties of the liquid. Once the liquid layer is deposited, the liquid may be evaporated at elevated or room temperature to remove the liquid and leave only the particles. In another embodiment, a layer of particles may be sprayed directly on the substrate surface 120. The particles may be formed of metals such as gold or aluminum, ceramics such as alumina or silicon carbide or silica or boron nitride, carbon such as graphite or bucky balls, or organic materials.

In processes using a dry etch, a damaged layer of material may remain on the morphed portions 122 of the emitting surface 120. In these cases, the material forming the damaged layer may be removed by etching the morphed portions 122 using known chemical etching processes, such as a KOH process or flowing gases such as hydrogen or hydrogen chloride. Alternatively, the damaging affects of the material forming the damaged layer may be substantially reduced by annealing processes. In this case, the annealing process serves two functions; it activates the dopants in the substrate and it reduces the affect of the damaged layer.

In another embodiment, the morphed portions 122 are created using well known grit polishing processes. In these processes, grit particles, e.g., diamond particles, abrade the light emitting surface 120 to change the surface morphology from a generally smooth surface to a roughened surface. The density of particles in the grit, the size of the particles, and the abrasive force between the particles and the surface 120 are selected such that the resultant surface morphology has a periodicity, profile and depth similar to the moth-eye surface achieved through the previously described RIE etching process.

With reference to FIG. 8, in another configuration, the morphed portions 122 are formed in a layer of material 132 that is deposited on top of the emitting surface 120 of the substrate 112. Preferably, the material has a refractive index that is substantially the same as the substrate. For example, the material 140 is deposited on a SiC substrate 112 may be SiC or AlInGaN; while the material deposited in a GaN substrate may be GaN. The material 140 also has the same n-type or p-type doping as the substrate 112. The material may be deposited using well known, lower temperature techniques, such as MOCVD, CVD, HVPE, MBE or sputtering. The desired surface morphology may be obtained through control of growth conditions, such as temperature. For example, a medium deposition temperature is more likely to produce the desired surface morphology as opposed to, too high or too cool deposition temperatures which would likely result in a smooth surface. Surface morphology formation is also dependent on the type of wide bandgap semiconductor being deposited. For GaN, the group V/III ratio will significantly impact morphology. Also, N-polar GaN is typically highly faceted grown under typical MOCVD growth conditions.

In another embodiment, particles of the substrate 112 material or a material having a similar index of refraction are deposited on the top surface 120 of the substrate. The particles are then mechanically fixed to the surface 120 through adhesion or annealing. The size, shape and density of the particles are selected such that the resultant surface morphology 122 has a periodicity, profile and depth similar to the moth-eye surface achieved through the previously described RIE etching process.

Although the present invention has been described in detail with reference to certain preferred configurations thereof, other versions are possible. For example, instead of a lateral-contact geometry LEDs, the processes described above may be applied to vertical-contact geometry LEDs. In vertical-contact geometry LEDs, care would have to be taken to protect the n-contact metal region during the ICP-RIE process.

Other etchant chemistries, including wet chemistry may be used. For example, GaP etching may be used as an alternative method to ICP-RIE for removal of surface damage. The ICP-RIE process may be applied to substrates of various thicknesses including those used in ultra thin LEDs such as the EZ-XT LEDs manufactured by Cree, Inc. The ICP-RIE process may also be applied to future 'thin chip' LEDs, including chip-scale package LEDs, where a highly scattering surface roughness is desired.

The present invention may be used in all flip-chip LED products, but especially large area LEDs. It is easiest to implement with lateral contact geometry devices but is applicable to vertical geometry devices as well. The ICP-RIE process may be applied to all ATON or otherwise cut surfaces to remove saw damage. The ICP-RIE process may be applicable for other types of LED substrates (sapphire, GaP, etc.).

It will be apparent from the foregoing that while particular forms of the invention have been illustrated and described, various modifications can be made without departing from the spirit and scope of the invention. Accordingly, it is not intended that the invention be limited, except as by the appended claims.

I claim:

1. A light emitting diode (LED) comprising:
   a conductive substrate having a first surface and a second surface, a portion of the first surface having a moth-eye morphology formed in said substrate by a maskless etching process;
   a light emission region on the second surface, the light emission region including an active layer between first and second oppositely doped layers;
   a first contact on the first surface and in contact with one of the first or second doped layers;
   a second contact in contact with the other of the first or second doped layers; and
   a current spreading structure in contact with the portion of the first surface having the moth-eye morphology and the first contact.

2. The LED of claim 1 further comprising a substantially smooth region on the first surface, wherein the first contact is on the smooth region.

3. The LED of claim 1 wherein the current spreading structure comprises:
   at least one conductive element on the first surface in contact with the first contact.

4. The LED of claim 1 wherein the current spreading structure comprises:
   a substantially smooth region on the first surface; and
   a conductive element on the smooth region and in contact with the first contact.

5. The LED of claim 1 wherein the current spreading structure comprises a transparent conducting layer on at least a portion of the first surface.

6. The LED of claim 5 wherein the transparent conducting layer is metallic.

7. The LED of claim 5 wherein the transparent conducting layer is doped semiconductor material.

8. The LED of claim 7 wherein the doped semiconductor material is part of the substrate.

9. A light emitting diode (LED) comprising:
   a conductive substrate having a nonporous first surface and a second surface, a portion of the first surface having a moth-eye morphology formed in said substrate by a maskless etching process;
   a light emission region on the second surface, the light emission region including an active layer between first and second oppositely doped layers;
   a first contact on the portion of the first surface having the moth-eye morphology and in contact with one of the first or second doped layers; and
   a second contact in contact with the other of the first or second doped layers.

* * * * *